(12) United States Patent
Remez et al.

(10) Patent No.: US 12,313,812 B2
(45) Date of Patent: May 27, 2025

(54) MOE-BASED ILLUMINATION PROJECTOR

(71) Applicant: APPLE INC., Cupertino, CA (US)

(72) Inventors: Roei Remez, Tel Aviv (IL); Moshe Kriman, Tel Aviv (IL); Yuval Tsur, Kfar Bin-Nun (IL); Maoz Ovadia, Kiryat Ono (IL); Yaron Gross, Netanya (IL); Omer Eden, Herzliya (IL); Alex Pekin, Ramat Gan (IL); Assaf Avraham, Givatayim (IL); Roey Zuitlin, Kiryat Ono (IL); Gidi Lasovski, Ramat Hasharon (IL); Refael Della Pergola, Jerusalem (IL)

(73) Assignee: APPLE INC., Cupertino, CA (US)

( * ) Notice: Subject to any disclaimer, the term of this patent is extended or adjusted under 35 U.S.C. 154(b) by 162 days.

(21) Appl. No.: 18/307,820

(22) Filed: Apr. 27, 2023

(65) Prior Publication Data

US 2024/0094437 A1   Mar. 21, 2024

Related U.S. Application Data

(60) Provisional application No. 63/408,124, filed on Sep. 20, 2022.

(51) Int. Cl.
| | | |
|---|---|---|
| *G01B 11/25* | (2006.01) | |
| *G02B 1/00* | (2006.01) | |
| *G02B 1/02* | (2006.01) | |
| *G02B 27/30* | (2006.01) | |

(52) U.S. Cl.
CPC ............ *G02B 1/002* (2013.01); *G01B 11/254* (2013.01); *G02B 1/02* (2013.01); *G02B 27/30* (2013.01)

(58) Field of Classification Search
CPC .......... G02B 1/002; G02B 1/02; G02B 27/30; G01B 11/254; H01S 5/423
USPC .................................................. 356/601–626
See application file for complete search history.

(56) References Cited

U.S. PATENT DOCUMENTS

| | | | |
|---|---|---|---|
| 4,069,463 A | 1/1978 | McGroddy et al. | |
| 4,935,939 A | 6/1990 | Liau et al. | |
| 5,812,571 A | 9/1998 | Peters | |
| 6,055,262 A | 4/2000 | Cox et al. | |
| 6,156,980 A | 12/2000 | Peugh et al. | |

(Continued)

FOREIGN PATENT DOCUMENTS

| | | |
|---|---|---|
| CN | 205123806 U | 3/2016 |
| CN | 107219711 A | 9/2017 |

(Continued)

OTHER PUBLICATIONS

CN Application # 2021105284688 Office Action dated Sep. 29, 2023.

(Continued)

*Primary Examiner* — Isiaka O Akanbi
(74) *Attorney, Agent, or Firm* — Meitar Patents Ltd.; Daniel Kligler

(57) ABSTRACT

An optoelectronic apparatus includes an array of emitters configured to emit beams of optical radiation. An optical substrate is mounted over the array. An optical metasurface is disposed on the optical substrate and configured to collimate and split each of the emitted beams into a respective group of collimated sub-beams, and to direct the collimated sub-beams toward a target to form a pattern of spots on the target.

18 Claims, 6 Drawing Sheets

(56) References Cited

U.S. PATENT DOCUMENTS

| | | |
|---|---|---|
| 6,597,713 B2 | 7/2003 | Ouchi |
| 6,625,028 B1 | 9/2003 | Dove et al. |
| 6,674,948 B2 | 1/2004 | Yeh et al. |
| 6,936,855 B1 | 8/2005 | Harrah |
| 7,126,218 B1 | 10/2006 | Darveaux et al. |
| 7,271,461 B2 | 9/2007 | Dutta |
| 7,303,005 B2 | 12/2007 | Reis et al. |
| 7,800,067 B1 | 9/2010 | Rajavel et al. |
| 7,949,024 B2 | 5/2011 | Joseph |
| 8,050,461 B2 | 11/2011 | Shpunt et al. |
| 8,193,482 B2 | 6/2012 | Itsler |
| 8,259,293 B2 | 9/2012 | Andreou |
| 8,275,270 B2 | 9/2012 | Shushakov et al. |
| 8,350,847 B2 | 1/2013 | Shpunt |
| 8,355,117 B2 | 1/2013 | Niclass |
| 8,405,020 B2 | 3/2013 | Menge |
| 8,604,603 B2 | 12/2013 | Lau et al. |
| 8,761,495 B2 | 6/2014 | Freedman et al. |
| 8,766,164 B2 | 7/2014 | Sanfilippo et al. |
| 8,963,069 B2 | 2/2015 | Drader et al. |
| 9,024,246 B2 | 5/2015 | Jiang et al. |
| 9,052,356 B2 | 6/2015 | Chu et al. |
| 9,076,707 B2 | 7/2015 | Harmon |
| 9,106,849 B2 | 8/2015 | Duggal et al. |
| 9,430,006 B1 | 8/2016 | Hayashida |
| 9,735,539 B2 | 8/2017 | Jiang et al. |
| 9,819,144 B2 | 11/2017 | Lin et al. |
| 9,826,131 B2 | 11/2017 | Alasirnio et al. |
| 10,034,375 B2 | 7/2018 | Pyper et al. |
| 10,103,512 B2 | 10/2018 | Jiang et al. |
| 10,305,247 B2 | 5/2019 | Bills et al. |
| 10,375,330 B2 | 8/2019 | Rephaeli et al. |
| 10,401,480 B1 | 9/2019 | Gaalema et al. |
| 10,454,241 B2 | 10/2019 | Jiang et al. |
| 10,470,307 B2 | 11/2019 | Pyper et al. |
| 10,551,886 B1 | 2/2020 | de la Fuente |
| 10,881,028 B1 | 12/2020 | Huang et al. |
| 11,296,136 B2 | 4/2022 | Nagai et al. |
| 11,699,715 B1 | 7/2023 | Alnahhas |
| 11,710,945 B2 | 7/2023 | Alnahhas et al. |
| 2002/0070443 A1 | 6/2002 | Mu et al. |
| 2002/0127752 A1 | 9/2002 | Thompson et al. |
| 2002/0176459 A1 | 11/2002 | Martinsen |
| 2003/0081385 A1 | 5/2003 | Mochizuki et al. |
| 2004/0001317 A1 | 1/2004 | Getz, Jr. et al. |
| 2004/0180470 A1 | 9/2004 | Romano et al. |
| 2007/0233208 A1 | 10/2007 | Kurtz et al. |
| 2007/0262441 A1 | 11/2007 | Chen |
| 2008/0240196 A1 | 10/2008 | Nishida |
| 2010/0164079 A1 | 7/2010 | Dekker et al. |
| 2010/0208132 A1 | 8/2010 | Shiraishi |
| 2011/0026264 A1 | 2/2011 | Reed et al. |
| 2011/0278629 A1 | 11/2011 | McDaniel et al. |
| 2012/0002293 A1 | 1/2012 | Du et al. |
| 2012/0051384 A1 | 3/2012 | Geske et al. |
| 2013/0015331 A1 | 1/2013 | Birk et al. |
| 2013/0163627 A1 | 6/2013 | Seurin |
| 2013/0342835 A1 | 12/2013 | Blaksberg |
| 2014/0231630 A1 | 8/2014 | Rae et al. |
| 2014/0348192 A1 | 11/2014 | Prujimboom et al. |
| 2014/0353471 A1 | 12/2014 | Raynor et al. |
| 2015/0092802 A1 | 4/2015 | Gronenborn et al. |
| 2015/0163429 A1 | 6/2015 | Dai et al. |
| 2015/0195956 A1 | 7/2015 | Linderman |
| 2015/0200222 A1 | 7/2015 | Webster |
| 2015/0200314 A1 | 7/2015 | Webster |
| 2015/0255955 A1 | 9/2015 | Wang et al. |
| 2015/0340841 A1* | 11/2015 | Joseph ............... H01S 5/04257 372/50.12 |
| 2015/0342023 A1 | 11/2015 | Refai-Ahmed et al. |
| 2015/0348865 A1 | 12/2015 | Vincent et al. |
| 2016/0025993 A1 | 1/2016 | Mor et al. |
| 2016/0300825 A1 | 10/2016 | Hoeppel |
| 2017/0078611 A1 | 3/2017 | Manico et al. |
| 2017/0170219 A1 | 6/2017 | Iwafuchi et al. |
| 2017/0353012 A1 | 12/2017 | Barve et al. |
| 2018/0092241 A1 | 3/2018 | Rasmussen et al. |
| 2018/0092253 A1 | 3/2018 | Qiu et al. |
| 2018/0239105 A1 | 8/2018 | Lee et al. |
| 2018/0310407 A1 | 10/2018 | Pyper et al. |
| 2019/0129035 A1 | 5/2019 | Valouch et al. |
| 2019/0264890 A1 | 8/2019 | Chang et al. |
| 2019/0268068 A1* | 8/2019 | Dacha ..................... G02B 5/02 |
| 2019/0295264 A1 | 9/2019 | Petilli |
| 2019/0324223 A1 | 10/2019 | Yim et al. |
| 2019/0326731 A1 | 10/2019 | Mathai et al. |
| 2019/0348819 A1 | 11/2019 | Laflaquiere et al. |
| 2019/0381939 A1 | 12/2019 | Rafalowski et al. |
| 2020/0096639 A1 | 3/2020 | Panas et al. |
| 2020/0105827 A1 | 4/2020 | Subramanya et al. |
| 2020/0284883 A1 | 9/2020 | Ferreira et al. |
| 2020/0388640 A1 | 12/2020 | Yu et al. |
| 2021/0083454 A1 | 3/2021 | Nakata et al. |
| 2021/0181311 A1* | 6/2021 | Donovan ................ G01S 17/89 |
| 2021/0313764 A1 | 10/2021 | Alnahhas et al. |
| 2021/0336424 A1 | 10/2021 | Hegblom et al. |
| 2022/0179125 A1 | 6/2022 | Ren et al. |
| 2022/0187631 A1 | 6/2022 | Jang et al. |
| 2022/0205611 A1* | 6/2022 | Yousefi ................... F21V 5/004 |
| 2023/0073962 A1 | 3/2023 | Hauser et al. |
| 2023/0220974 A1* | 7/2023 | Eilertsen ............ G01B 11/2536 362/235 |
| 2024/0094553 A1 | 3/2024 | Remez et al. |

FOREIGN PATENT DOCUMENTS

| | | |
|---|---|---|
| CN | 108332082 A | 7/2018 |
| CN | 208654319 U | 3/2019 |
| CN | 110867724 A | 3/2020 |
| CN | 210224593 U | 3/2020 |
| CN | 106444209 B | 5/2020 |
| CN | 110380211 B | 5/2021 |
| CN | 113359112 A | 9/2021 |
| CN | 110398850 B | 4/2023 |
| EP | 0949728 A1 | 10/1999 |
| WO | 2014087301 A1 | 6/2014 |
| WO | 2018093730 A1 | 5/2018 |
| WO | 2018132521 A1 | 7/2018 |
| WO | 2019149778 A1 | 8/2019 |
| WO | 2020026616 A1 | 2/2020 |
| WO | 2020039086 A1 | 2/2020 |
| WO | 2020074351 A1 | 4/2020 |

OTHER PUBLICATIONS

U.S. Appl. No. 17/221,856 Office Action dated Jun. 24, 2024.
Burrows, "Metalens grows up—Researchers develop a mass-producible, centimeter-scale Metalens for VR, Imaging," Harvard School of Engineering and Applied Sciences, pp. 1-4, Dec. 3, 2019.
Thorlabs, Inc., "Introduction to Diffraction Grating, " Optics Selection Guide in Product Catalog, pp. 798-808, years 1999-2023, as downloaded from https://www.thorlabs.com/catalogpages/805.pdf.
Nielsen et al., "Meta Optical Elements—The Technology of Flat Metalenses," Tech Briefs, SAE Media Group, pp. 1-8, Sep. 1, 2022, as downloaded from https://www.techbriefs.com/component/content/article/tb/supplements/bit/features/technology-leaders/46527.
Boulder Nonlinear Systems, "High-Definition Time-of-Flight Imaging," Product Information, pp. 1-10, year 2022, as downloaded from https://web.archive.org/web/20220124203941/https://www.bnonlinear.com/case-studies/high-definition-time-flight-imaging.
U.S. Appl. No. 17/221,856 Office Action dated Mar. 20, 2024.
U.S. Appl. No. 18/321,025 Office Action dated Apr. 12, 2024.

* cited by examiner

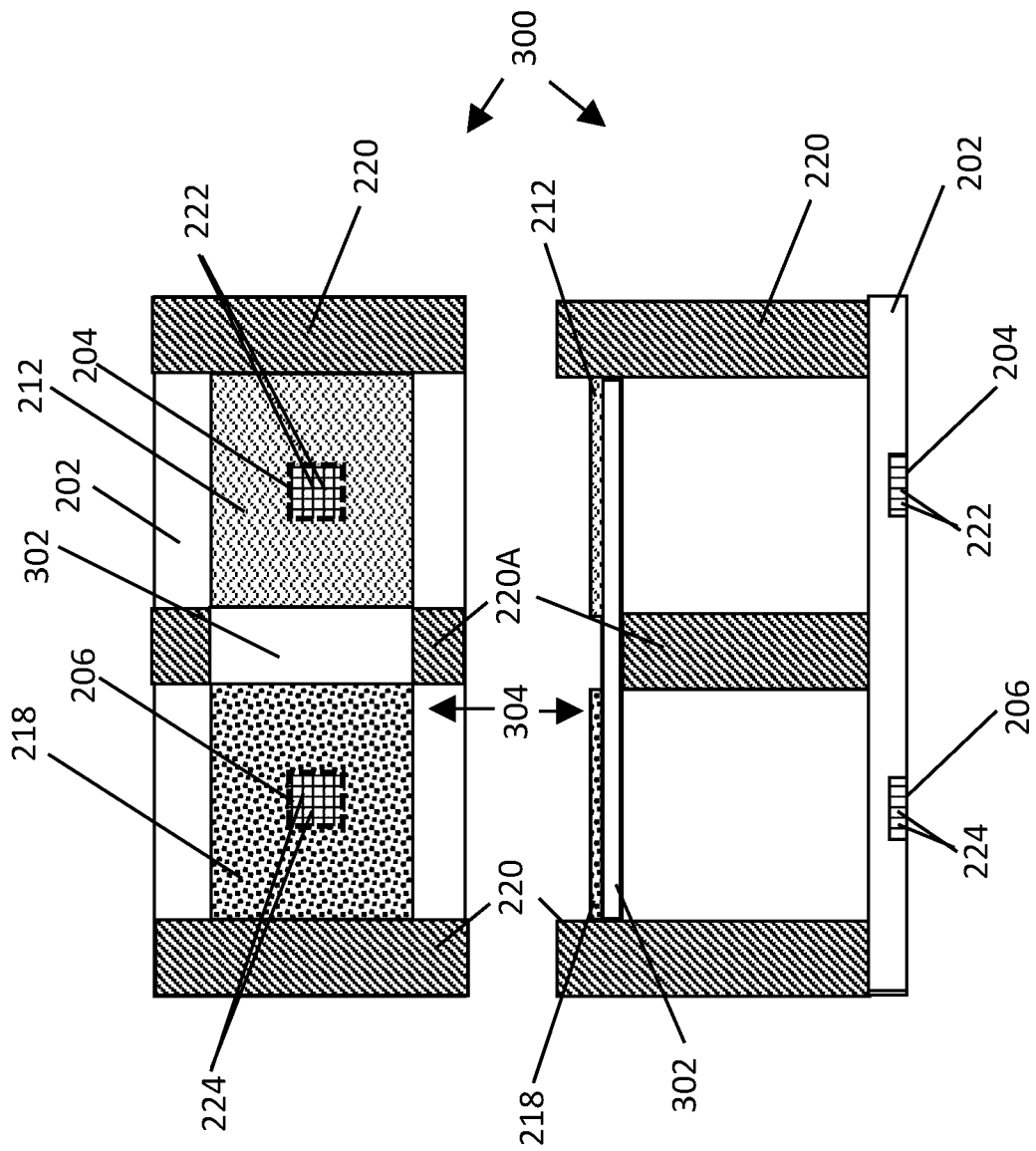

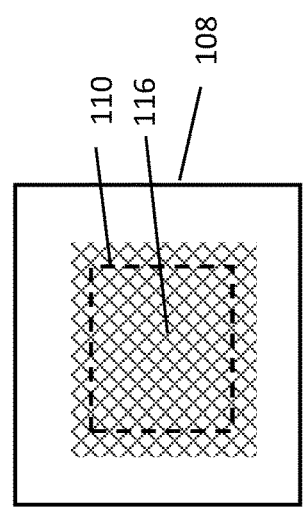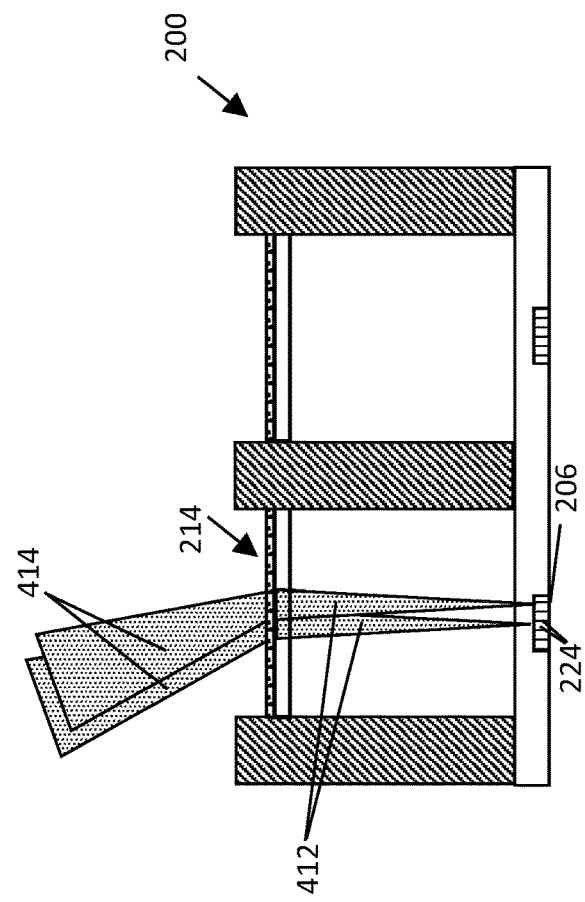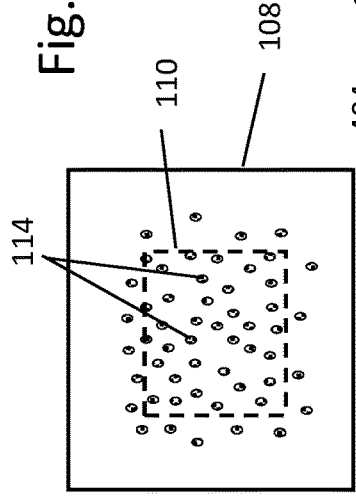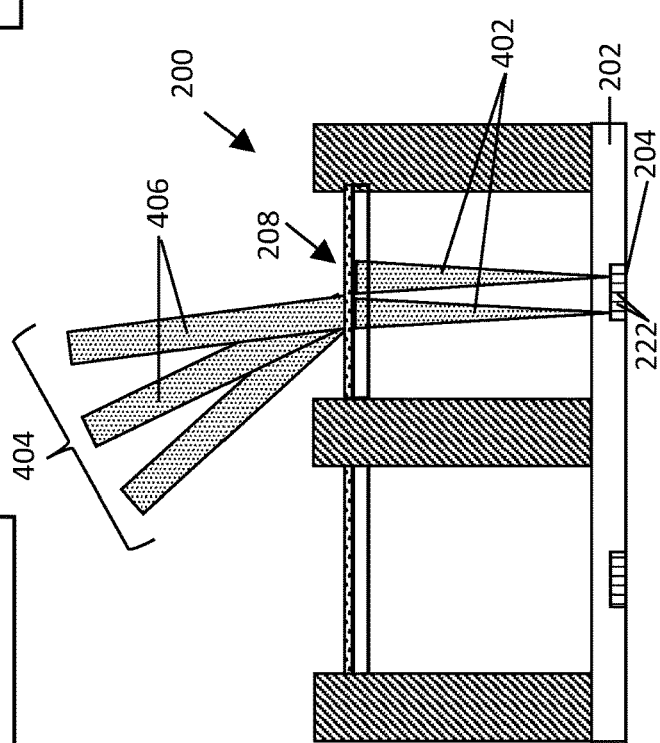
Fig. 5A
Fig. 5B

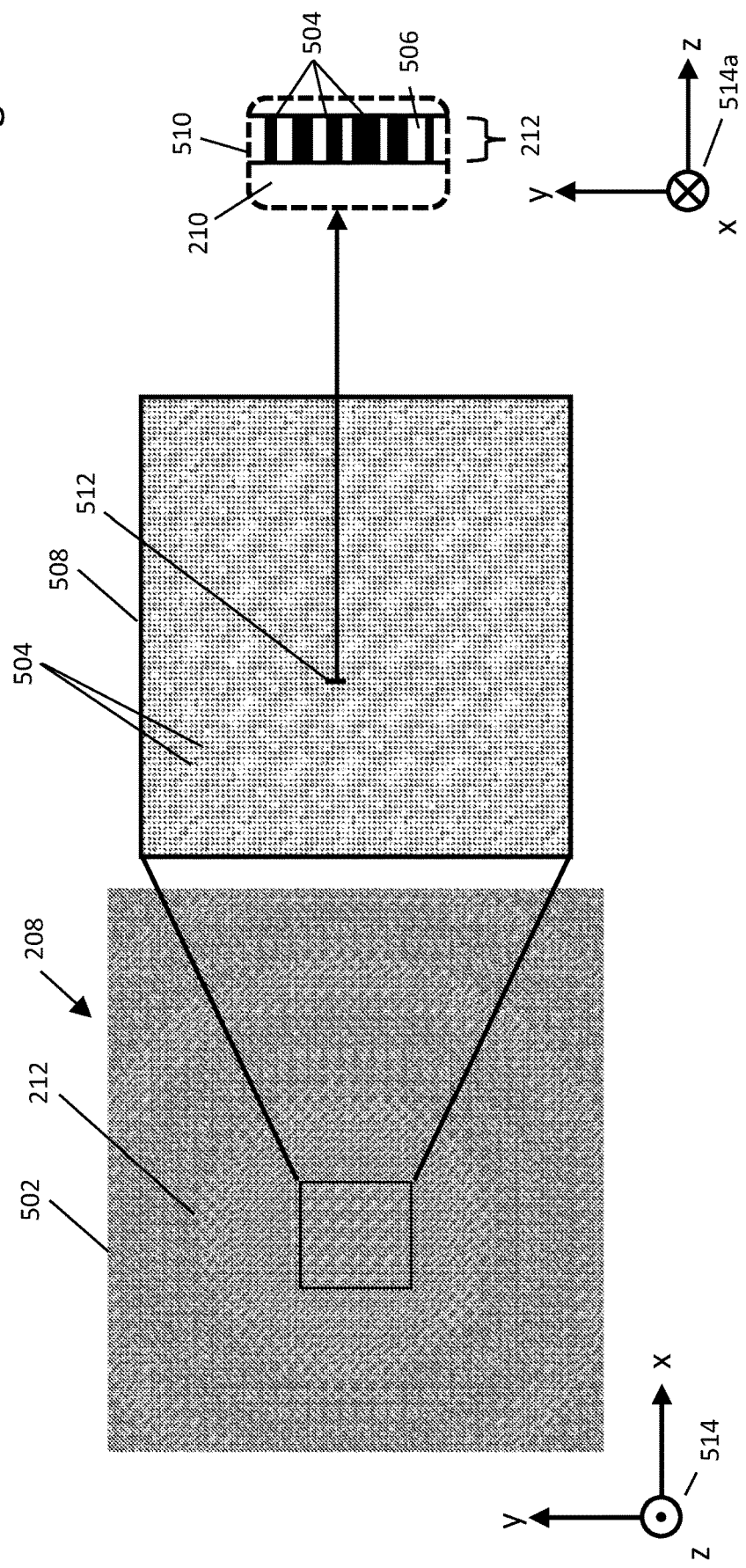

MOE-BASED ILLUMINATION PROJECTOR

CROSS-REFERENCE TO RELATED APPLICATION

This application claims the benefit of U.S. Provisional Patent Application 63/408,124, filed Sep. 20, 2022, which is incorporated herein by reference.

FIELD OF THE INVENTION

The present invention relates generally to optoelectronic devices, and particularly to sources of optical radiation.

BACKGROUND

Various sorts of portable computing devices (referred to collectively as "portable devices" in the description), such as smartphones, augmented reality (AR) devices, virtual reality (VR) devices, smart watches, and smart glasses, comprise compact sources of optical radiation. For example, one source may emit flood radiation, illuminating a target region with uniform illumination (flood illumination) over a wide field of view for the purpose of capturing a color or a monochromatic image. Another source may, for example, project patterned radiation (spot illumination) so as to illuminate the target region with a pattern of spots for three-dimensional (3D) mapping of the region.

The terms "optical rays," "optical radiation," and "light," as used in the present description and in the claims, refer generally to electromagnetic radiation in any or all of the visible, infrared, and ultraviolet spectral ranges.

Optical metasurfaces are thin layers that comprise a two-dimensional pattern of structures, having dimensions (pitch and thickness) less than the target wavelength of the radiation with which the metasurface is designed to interact. Optical elements comprising optical metasurfaces are referred to herein as "metasurface optical elements" (MOEs).

The term "diffuser" refers to an optical element that scatters light so as to homogenize and increase the angular uniformity of the light passing through the optical element.

U.S. Patent Application Publication 2021/0364902 describes an optoelectronic apparatus, which includes a heat sink shaped to define a base, a first platform at a first elevation above the base, and a second platform alongside the first platform at a second elevation above the base, which is different from the first elevation. A first monolithic emitter array is mounted on the first platform and is configured to emit first optical beams. A second monolithic emitter array is mounted on the second platform and is configured to emit second optical beams. An optical element is configured to direct both the first and the second optical beams toward a target region.

SUMMARY

Embodiments of the present invention that are described hereinbelow provide improved designs and methods of fabrication of sources of optical radiation.

There is therefore provided, in accordance with an embodiment of the invention, an optoelectronic apparatus, including an array of emitters configured to emit beams of optical radiation and an optical substrate mounted over the array. An optical metasurface is disposed on the optical substrate and configured to collimate and split each of the emitted beams into a respective group of collimated sub-beams, and to direct the collimated sub-beams toward a target to form a pattern of spots on the target.

In some embodiments, each of the beams is emitted from the array along a respective first axis, while the respective group of the collimated sub-beams is centered on a second axis, and the optical metasurface is configured to apply an angular tilt to the second axis relative to the first axis. In a disclosed embodiment, the apparatus includes a camera, which is configured to capture an image of the target over a given field of view, wherein the optical metasurface is configured to apply the angular tilt to the second axis so that the pattern of spots extends across the field of view.

Additionally or alternatively, the pattern of spots is formed over an area of the target, and the apparatus includes a camera, which is configured to capture an image of the target over a given field of view, wherein the camera includes a further optical metasurface configured to apply an angular tilt to the field of view of the camera so that the field of view covers the area over which the pattern of spots is formed.

In a disclosed embodiment, the emitters include vertical-cavity surface-emitting lasers (VCSELs).

In some embodiments, the optical metasurface includes an arrangement of pillars of varying diameters, which are formed on a surface of the optical substrate. The pillars may include a semiconductor material and/or a metallic material.

In some embodiments, the beams that are split by the optical metasurface are first beams, and the optical metasurface that splits the first beams is a first optical metasurface, and the apparatus includes a further array of emitters configured to emit second beams of optical radiation, and a second optical metasurface configured to diffuse the second beams and to direct the diffused second beams toward the target and to illuminate the target with flood illumination. In a disclosed embodiment, the second optical metasurface is configured to focus and tilt the diffused second beams toward the target. Additionally or alternatively, the first and second optical metasurfaces are both formed on the same optical substrate. In one embodiment, the apparatus includes a controller, which is configured to actuate the emitters selectively, so as to illuminate the target alternately with the pattern of spots and with the flood illumination.

There is also provided, in accordance with an embodiment of the invention, a method for optical projection, which includes driving an array of emitters to emit beams of optical radiation. Using an optical metasurface, each of the emitted beams is collimated and split into a respective group of collimated sub-beams, and the collimated sub-beams are directed toward a target to form a pattern of spots on the target.

The present invention will be more fully understood from the following detailed description of the embodiments thereof, taken together with the drawings in which:

BRIEF DESCRIPTION OF THE DRAWINGS

FIGS. 4A and 4B are schematic frontal and sectional views, respectively, of a projection module, in accordance with an alternative embodiment of the invention;

FIGS. 5A and 5B are schematic side views of the projection module of FIGS. 3A-B used respectively for spot illumination and flood illumination of a target, in accordance with an embodiment of the invention; and FIG. 6 is a schematic frontal view of a portion of a spot MOE, in accordance with an embodiment of the invention.

DETAILED DESCRIPTION OF EMBODIMENTS

Overview

Structured light projectors that are used to project patterns of spots in portable devices typically comprise at least two separate optical elements: a diffractive optical element (DOE), which splits each of the beams emitted by an array of light sources into multiple sub-beams, and a collimating lens, which projects the beams to form a corresponding pattern of spots on a target. (The order of the elements may be reversed, with the collimator before the splitter.) Although projectors of this sort have been made compact enough to fit into a smartphone, there is a need for still more compact designs.

Embodiments of the present invention that are described herein address this need using an MOE, which combines both beamsplitting and collimation capabilities in a single, flat element. The disclosed embodiments provide optoelectronic apparatus comprising a pattern projector, which comprises an array of emitters, which emit beams of optical radiation, and an MOE mounted over the array. The MOE comprises an optical substrate with an optical metasurface, which both collimates and splits each of the emitted beams into a respective group of collimated sub-beams, and directs the collimated sub-beams toward a target to form a pattern of spots on the target. Combining the projector optics into a single MOE not only reduces the size and cost of the pattern projector, but also simplifies assembly and reduces the sensitivity of the design to fabrication errors, relative to designs using multiple optical elements.

In some embodiments, that apparatus also comprises a camera, which captures images of the part of the target that falls within its field of view (FOV). As the axis of the pattern projector is typically offset transversely relative to the camera, it is desirable that the direction of the projected pattern be tilted toward the camera axis to increase the overlap between the area of the pattern and the FOV of the camera. Therefore, in some embodiments, the same MOE simultaneously applies an angular tilt to the projection axis relative to the camera axis (in addition to its collimation and beamsplitting functions), so that the pattern of spots extends across the FOV.

In some embodiments, the same optoelectronic apparatus also projects flood illumination onto the target. For this purpose, the apparatus comprises a second array of emitters and a second optical metasurface, which diffuses the beams emitted by the second array. The second metasurface may be disposed on the same optical substrate as the metasurface used to form the pattern of spots, or on a separate substrate. The second metasurface produces overlapping homogeneous beams of radiation and may also focus and tilt the beams toward the target, thus illuminating the FOV of the camera with flood illumination.

A controller actuates the two arrays of emitters separately, so the FOV of the camera may be alternately illuminated by spot illumination and by flood illumination.

Optoelectronic Apparatus

Figure 1:
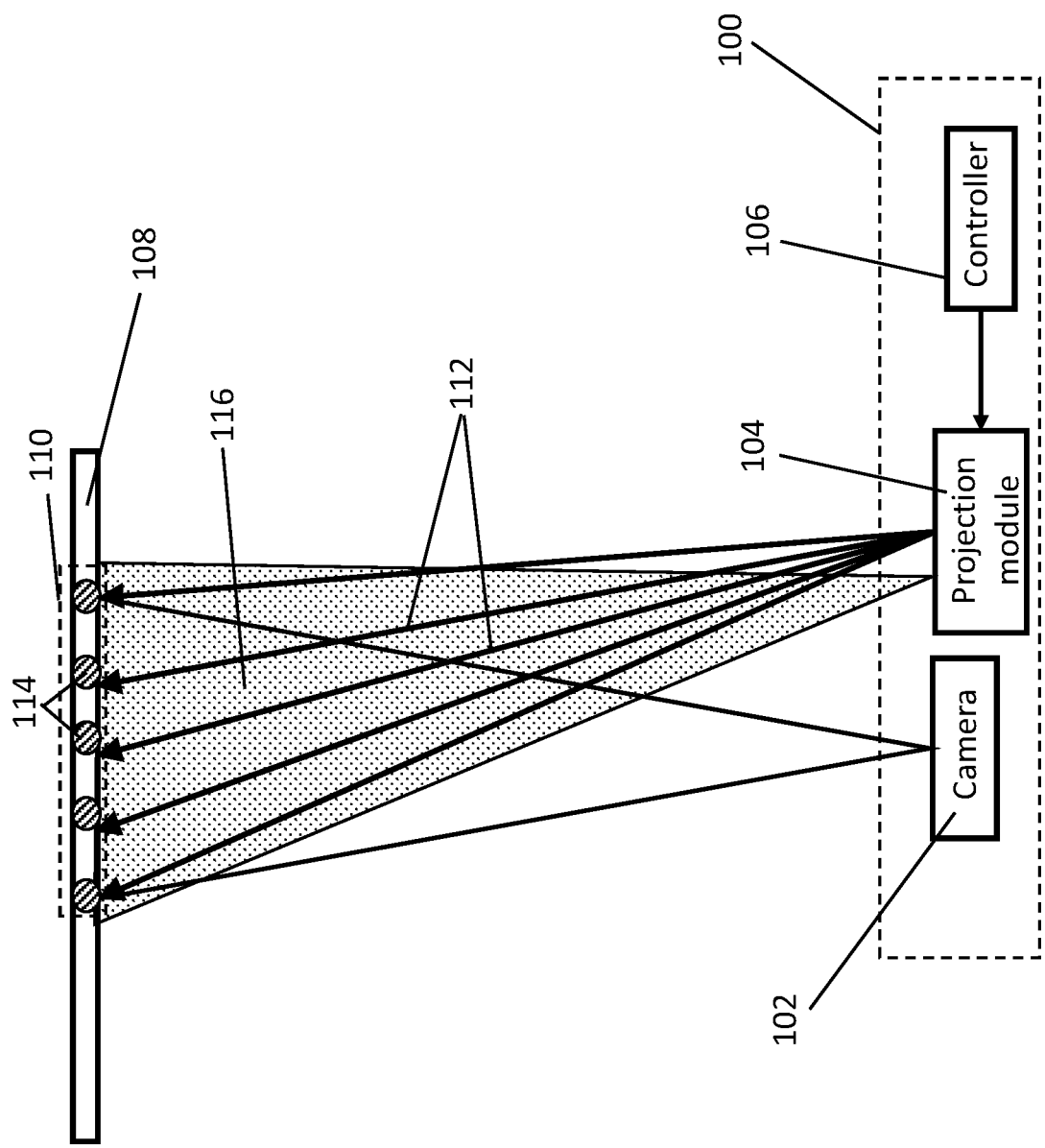
FIG. 1 is a schematic side view of an optoelectronic apparatus, in accordance with an embodiment of the invention.

FIG. 1 is a schematic side view of an optoelectronic apparatus 100, in accordance with an embodiment of the invention. Optoelectronic apparatus 100 comprises a camera 102, a projection module (source of optical radiation) 104, and a controller 106. Camera 102 captures an image of a target 108 over an FOV 110. Under the control of controller 106, projection module 104 emits either multiple beams 112 of optical radiation, illuminating FOV 110 with a pattern of spots 114, or a homogeneous beam 116 of flood illumination projected toward the FOV. Both beams 112 and homogeneous beam 116 are tilted toward FOV 110 in order to provide full coverage of illumination to the FOV.

Figure 2:
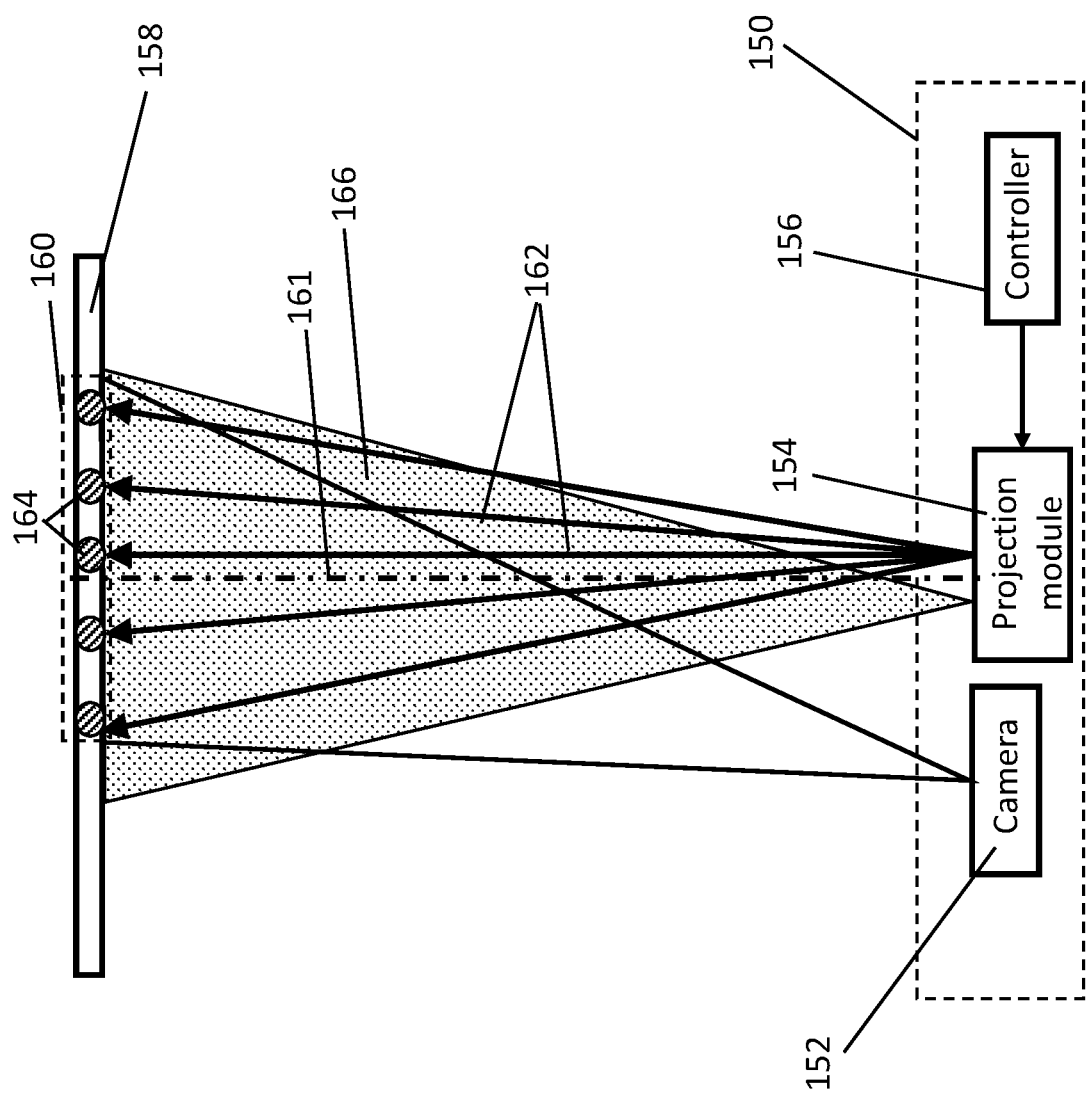
FIG. 2 is a schematic side view of an optoelectronic apparatus, in accordance with an alternative embodiment of the invention.

FIG. 2 is a schematic side view of an optoelectronic apparatus 150, in accordance with an alternative embodiment of the invention. Apparatus 150 comprises a camera 152, a projection module 154, and a controller 156. Apparatus 150 is similar to apparatus 100 (FIG. 1), with the exception that a tilt is applied to the imaging optics of camera 152, for example by incorporation of a suitable MOE in the imaging optics, rather than in projection module 154. Camera 152 captures an image of a target 158 over an FOV 160, wherein the tilt applied in the camera has shifted the FOV so as to align it with illumination emitted by projection module 154 around a normal 161 to the target. Under the control of controller 156, projection module 154 emits either multiple beams 162 of optical radiation, illuminating FOV 160 with a pattern of spots 164, or a homogeneous beam 166 of flood illumination projected toward the FOV. The tilt applied to the imaging optics of camera 152 has shifted FOV 160 so that both beams 162 and homogeneous beam 166 provide full coverage of illumination to the FOV.

Alternatively, separate tilts may be applied to both camera 152 and to projection module 154 so as to shift both FOV 160, as well as the pattern of spots 164 and flood illumination 166, to provide full coverage of illumination to the FOV.

Figures 3A, 3B:
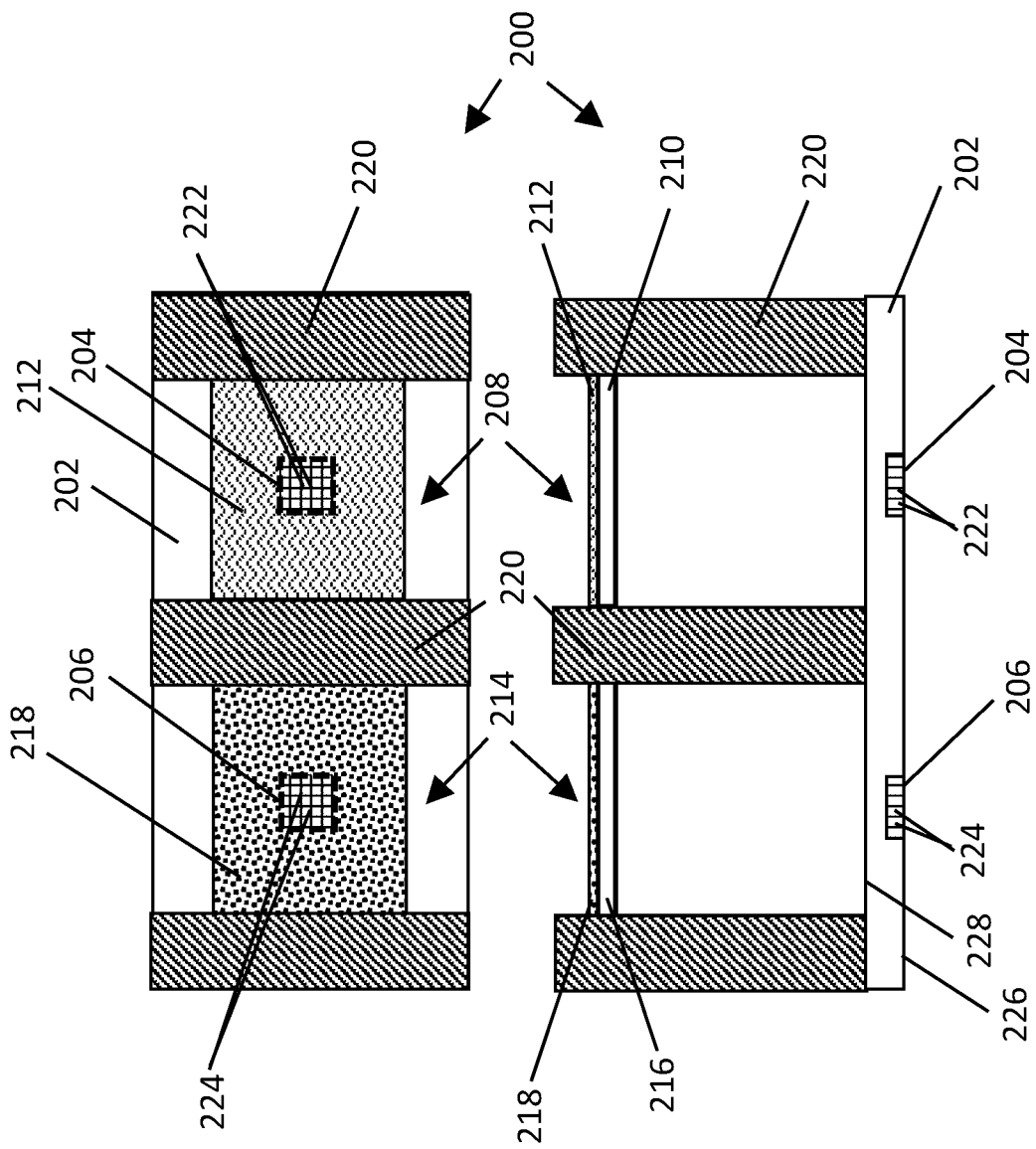
FIGS. 3A and 3B are schematic frontal and sectional views, respectively, of a projection module, in accordance with an embodiment of the invention.

FIGS. 3A and 3B are schematic frontal and sectional views, respectively, of a projection module 200, in accordance with an embodiment of the invention. Projection module 200 may be used in place of projection module 104 in optoelectronic apparatus 100 for both spot and flood illumination. Projection module 200 comprises a semiconductor substrate 202, on which two arrays of emitters of optical radiation are fabricated: a spot array 204 and a flood array 206. (The functions of arrays 204 and 206 will be described with reference to FIGS. 5A and 5B hereinbelow.) Projection module 200 further comprises two MOEs, each comprising an optical metasurface formed on a respective optical substrate: a spot MOE 208, comprising an optical substrate 210 and an optical metasurface 212, and a flood MOE 214, comprising an optical substrate 216 and an optical metasurface 218. Using spacers 220, MOEs 208 and 214 are mounted over respective emitter arrays 204 and 206, for example at a distance of 2-4 mm. Optical substrates 210 and 216 comprise glass or quartz ($SiO_2$) blanks, for example 210 µm thick.

Emitter arrays 204 and 206 comprise respective vertical-cavity surface-emitting lasers (VCSELs) 222 and 224, with semiconductor substrate 202 comprising, for example a 150 µm thick GaAs wafer. In alternative embodiments other emitters of optical radiation and other substrate materials may be employed.

Spot array 204 and flood array 206 have been formed on a lower side 226 of semiconductor substrate 202, and their respective VCSELs emit their beams of optical radiation through the substrate (backside illumination). Alternatively, spot array 204 and flood array 206 may be formed on an upper side 228 of substrate 202.

FIGS. 4A and 4B are schematic frontal and sectional views, respectively, of a projection module 300, in accordance with an alternative embodiment of the invention. Projection module 300, which may be used in place of projection module 104 in optoelectronic apparatus 100, is similar or identical to projection module 200 (FIGS. 3A and 3B), except for the optical substrate and one of the spacers, as will be described hereinbelow. Items similar or identical to those in FIGS. 3A and 3B are labelled with the same labels.

In the pictured embodiment, optical metasurfaces 212 and 218 are formed on a common optical substrate 302, forming a compound MOE 304, which performs the same functions as spot MOE 208 and flood MOE 214 in projection module 200. A middle spacer 220A has been modified to accommodate common optical substrate 302.

FIGS. 5A and 5B are schematic side views of projection module 200 used respectively for spot illumination and flood illumination of target 108, in accordance with an embodiment of the invention. For the sake of clarity, only the relevant elements of projection module 200 have been labelled in FIGS. 5A and 5B. Target 108, as well as items on the target, have been labelled according to FIG. 1.

For illuminating target 108 with spot illumination (FIG. 5A), controller 106 (FIG. 1) actuates VCSELs 222 of spot array 204. Each VCSEL 222 emits a diverging beam 402 of optical radiation. Spot MOE 208 splits and collimates beams 402 into groups 404 of collimated sub-beams 406 and applies an angular tilt to each group 404 so as to project the groups toward target 108 and to illuminate FOV 110 with spots 114. (For the sake of clarity, only one group 404 of sub-beams is shown, with a large tilt angle. In practice the tilt may be smaller, for example 2°, shifting the spread of the complete set of sub-beams from ±20° to the range +22° to −18°.) In the pictured embodiment, group 404 comprises three sub-beams 406. Alternatively, group 404 may comprise other numbers of sub-beams, such as 2, 4, 5, or even more.

For illuminating target 108 with flood illumination (FIG. 5B), controller 106 actuates VCSELs 224 of flood array 206. Each VCSEL 224 emits a diverging beam 412 of optical radiation. Flood MOE 214 diffuses beams 412 into overlapping homogenized beams 414 and applies an angular tilt to each beam 414 so as to project the overlapping beams toward target 108 and to illuminate FOV 110 with flood illumination 116. Flood illumination 116 is substantially uniform, meaning that the intensity of illumination over the FOV 110 is constant to within a specified tolerance.

FIG. 6 is a schematic frontal view 502 of a portion of spot MOE 208, in accordance with an embodiment of the invention.

As described hereinabove (referring to FIGS. 3A and 3B), spot MOE 208 comprises optical metasurface 212 formed on optical substrate 210. Optical metasurface 212 comprises an arrangement of pillars 504 of varying diameters, which are formed on a surface of optical substrate 210. In one embodiment, pillars 504 comprise a semiconductor material, such as silicon (Si), etched from a silicon layer deposited on optical substrate 210. Pillars 504 are embedded in a silicon dioxide ($SiO_2$) layer 506. Alternatively, pillars 504 may comprise a metallic material, etched from a suitable metal layer. Further alternatively, pillars 504 may be fabricated by other techniques, such as etching pillar-shaped holes in $SiO_2$ layer 506, back-filling the holes with a desired pillar material, and then polishing the top of the $SiO_2$ layer.

The diameter of each pillar 504 determines the local phase change imposed on an optical field impinging on the metasurface. As the diameters of pillars 504 are typically less than 0.4 micron and the center-to-center spacing between the pillars is typically less than half the wavelength of light impinging on spot MOE 208, they are illustrated in a magnified inset 508 of frontal view 502, as well as in a partial sectional view 510 taken along a line 512 of inset 508 and magnified still further. Cartesian coordinates 514 relate to frontal view 502 and to inset 508, while Cartesian coordinates 514a relate to sectional view 510. Thus, frontal view 502, as well as inset 508 are viewed in the xy-plane, whereas partial sectional view 510 is viewed in the yz-plane.

Design of Metasurface Optical Elements

As previously described, spot MOE 208 applies three functions to the optical beams impinging on the spot MOE: 1) collimation, 2) beamsplitting, and 3) tilting. Collimation and tilting require that spot MOE 208 applies an optical phase function $\Phi(x,y)$ to an impinging optical field, wherein x and y refer to Cartesian coordinates 514 (FIG. 6). Phase function $\Phi(x,y)$ is computed from geometrical optics using the following equation:

$$\phi(x, y)[\text{rad}] = \frac{A_t x}{\lambda} + \frac{2\pi}{\lambda} \sum_{n=1}^{10} A_n (x^2 + y^2)^n.$$

In an example embodiment, the coefficients $A_n$ of the quadratic phase components are given in Table 1 and the coefficient of the tilt $A_t$ and wavelength $\lambda$ are given in Table 2, with the units of x, y, and $\lambda$ in millimeters:

TABLE 1

Coefficients $A_n$

| n | An |
|---|---|
| 1 | −0.20242915 |
| 2 | 0.000854313 |
| 3 | −0.001601123 |
| 4 | 0.003961048 |
| 5 | −0.004646538 |
| 6 | −0.00152586 |
| 7 | 0.001715241 |
| 8 | 0.005897198 |
| 9 | −0.003087979 |
| 10 | −0.001142388 |

TABLE 2

Coefficient $A_t$ and wavelength $\lambda$

| $A_t$ | 0.041 |
|---|---|
| $\lambda$ | 0.00094 |

A further phase function $\Phi_{BS}(x,y)$ for splitting the optical beams by MOE 208 is calculated by an Iterative Fourier Transform Algorithm (IFTA). The total phase function $\Phi_{TOT}=(x,y)$ of MOE 208 is the sum of the optical phase function $\Phi(x,y)$ and the beamsplitting phase function $\Phi_{BS}(x,y)$:

$$\Phi_{TOT}(x,y)=\Phi(x,y)+\Phi_{BS}(x,y)$$

The computed value of the total phase function $\Phi_{TOT}(x,y)$ at the location of each pillar 504 is converted to a diameter of that pillar according to data provided by the metasurface manufacturer, and considering fabrication tolerances for dimensions such as the pillar sidewall angle and pillar height. A photolithographic mask for producing metasurface 212 with these pillar diameters is patterned according to these diameters, and MOE 208 is fabricated accordingly.

In alternative embodiments, the total phase function $\Phi_{TOT}(x,y)$ may be generalized to comprise N phase functions $\Phi_i(x,y)$, wherein i=1, N and N is an integer, such as 2, 3, 4, or even larger:

$$\Phi_{TOT}(x,y)=\Phi_1(x,y)+\Phi_2(x,y)+ \ldots +\Phi_i(x,y)+ \ldots +\Phi_N(x,y)$$

$\Phi_{TOT}(x,y)$ applies all the N phase functions $\Phi_i(x,y)$ to the impinging optical field in a multiplexed fashion. For example, phase functions $\Phi_i(x,y)$ may, in addition to a lens function, tilt function, and a beamsplitter function, comprise a bi-axial distortion or a checkerboard pattern.

For diffusing beams 412 for flood illumination (FIG. 5B), optical metasurface 218 of flood MOE 214 combines one or more of the following functions into a single metasurface: 1) an array of lenses, 2) a diffuser, and 3) a beamsplitter. Alternatively, MOE 214 may perform only a subset of these functions. In addition, optical metasurface 218 may apply a tilt to the diffused beams in order to project them toward FOV 110. When optical metasurface 218 does not function as an array of lenses, flood emitter array 206 may be rotated around an axis perpendicular to semiconductor substrate 202 in order to mitigate non-uniformities in the flood illumination due to effects of aliasing between the pattern of pillars on the metasurface and the flood emitter array.

As described hereinabove for spot MOE 208, a total phase function, describing the phase applied by flood MOE 214 to an impinging optical field, may similarly comprise several optical phase functions, which are applied to the impinging optical field in a multiplexed fashion.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic apparatus, comprising:
    an array of emitters configured to emit beams of optical radiation, wherein each of the beams is emitted from the array along a respective first axis;
    an optical substrate mounted over the array; and
    an optical metasurface disposed on the optical substrate and configured to collimate and split each of the emitted beams into a respective group of collimated sub-beams centered on a respective second axis, and to direct the collimated sub-beams toward a target to form a pattern of spots on the target,
    wherein the optical metasurface is configured to implement an optical phase function that includes a tilt component having a tilt coefficient selected to apply a predefined angular tilt to each respective second axis relative to the respective first axis.

2. The optoelectronic apparatus according to claim 1, and comprising a camera, which is configured to capture an image of the target over a given field of view, wherein the optical metasurface is configured to apply the angular tilt to each respective second axis so that the pattern of spots extends across the field of view.

3. The optoelectronic apparatus according to claim 1, wherein the pattern of spots is formed over an area of the target, and wherein the apparatus comprises a camera, which is configured to capture an image of the target over a given field of view, and wherein the camera comprises a further optical metasurface configured to apply an angular tilt to the field of view of the camera so that the field of view covers the area over which the pattern of spots is formed.

4. The apparatus according to claim 1, wherein the emitters comprise vertical-cavity surface-emitting lasers (VCSELs).

5. The optoelectronic apparatus according to claim 1, wherein the optical metasurface comprises an arrangement of pillars of varying diameters, which are formed on a surface of the optical substrate.

6. The optoelectronic apparatus according to claim 5, wherein the pillars comprise a semiconductor material.

7. The optoelectronic apparatus according to claim 6, wherein the pillars comprise a metallic material.

8. The optoelectronic apparatus according to claim 1, wherein the beams that are split by the optical metasurface are first beams, and the optical metasurface that splits the first beams is a first optical metasurface, and
    wherein the apparatus comprises a further array of emitters configured to emit second beams of optical radiation, and a second optical metasurface configured to diffuse the second beams and to direct the diffused second beams toward the target and to illuminate the target with flood illumination.

9. The optoelectronic apparatus according to claim 8, and wherein the second optical metasurface is configured to focus and tilt the diffused second beams toward the target.

10. The optoelectronic apparatus according to claim 8, wherein the first and second optical metasurfaces are both formed on the same optical substrate.

11. The optoelectronic apparatus according to claim 8, and comprising a controller, which is configured to actuate the emitters selectively, so as to illuminate the target alternately with the pattern of spots and with the flood illumination.

12. A method for optical projection, comprising:
    driving an array of emitters to emit beams of optical radiation, wherein each of the beams is emitted from the array along a respective first axis; and
    using an optical metasurface, collimating and splitting each of the emitted beams into a respective group of collimated sub-beams centered on a respective second axis, and directing the collimated sub-beams toward a target to form a pattern of spots on the target,
    wherein the optical metasurface is configured to implement an optical phase function that includes a tilt component having a tilt coefficient selected to apply a predefined angular tilt to each respective second axis relative to the respective first axis.

13. The method according to claim 12, and comprising capturing an image of the target over a given field of view, wherein applying the angular tilt comprises directing each respective second axis so that the pattern of spots extends across the field of view.

14. The method according to claim 12, wherein directing the collimated sub-beams comprises forming the pattern of spots over an area of the target, and wherein the method comprises capturing an image of the target over a field of view of a camera using a further optical metasurface to apply an angular tilt to the field of view so that the field of view covers the area over which the pattern of spots is formed.

15. The method according to claim 12, wherein the optical metasurface comprises forming an arrangement of pillars of varying diameters on a surface of an optical substrate.

16. The method according to claim 12, wherein the beams that are split by the optical metasurface are first beams, and the optical metasurface that splits the first beams is a first optical metasurface, and
   wherein the method comprises driving a further array of emitters to emit second beams of optical radiation, and applying a second optical metasurface to diffuse the second beams and to direct the diffused second beams toward the target and to illuminate the target with flood illumination.

17. The method according to claim 16, and wherein applying the second optical metasurface comprises focusing and tilting the diffused second beams toward the target.

18. The method according to claim 16, wherein driving the array and the further array comprises actuating the emitters selectively, so as to illuminate the target alternately with the pattern of spots and with the flood illumination.

* * * * *